United States Patent [19]

Bradley et al.

[11] Patent Number: 4,847,502
[45] Date of Patent: Jul. 11, 1989

[54] DUAL CATHODE SYSTEM FOR ELECTRON BEAM INSTRUMENTS

[75] Inventors: James G. Bradley, Altadena; Joseph M. Conley, La Canada; David B. Wittry, Pasadena, all of Calif.

[73] Assignee: The United States of America as represented by the Administrator of the National Aeronautics and Space Administration, Washington, D.C.

[21] Appl. No.: 84,062

[22] Filed: Aug. 11, 1987

[51] Int. Cl.$^4$ ............................................. H01J 3/02
[52] U.S. Cl. ...................... 250/396 ML; 250/396 R; 250/310; 219/121.28
[58] Field of Search .......... 250/396 R, 396 ML, 398, 250/296, 297, 298, 310; 219/121.28

[56] References Cited

U.S. PATENT DOCUMENTS

| | | | |
|---|---|---|---|
| 2,436,676 | 2/1948 | Smith et al. | 250/49.5 |
| 3,565,438 | 4/1971 | Pease | 250/49.5 |
| 3,659,236 | 4/1972 | Whitehead, Jr. | 335/210 |
| 4,209,698 | 6/1980 | Hoppe | 250/311 |
| 4,426,583 | 1/1984 | Chang et al. | 250/398 |
| 4,438,336 | 3/1984 | Riecke | 250/398 |
| 4,479,060 | 10/1984 | Tamura et al. | 250/398 |
| 4,593,196 | 6/1986 | Yates | 250/305 |

FOREIGN PATENT DOCUMENTS

| | | | |
|---|---|---|---|
| 0005551 | 1/1984 | Japan | 250/396 R |
| 0154442 | 8/1985 | Japan | 250/396 R |

Primary Examiner—Bruce C. Anderson
Assistant Examiner—John A. Miller
Attorney, Agent, or Firm—Thomas H. Jones; Paul F. McCaul; John R. Manning

[57] ABSTRACT

An electron beam source having a single electron optical axis is provided with two coplanar cathodes equally spaced on opposite sides from the electron optical axis. A switch permits selecting either cathode, and a deflection system comprised of electromagnets, each with separate pole pieces equally spaced from the plane of the cathodes and electron optical axis, first deflects the electron beam from a selected cathode toward the electron optical axis, and then in an opposite direction into convergence with the electron optical axis. The result is that the electron beam from one selected cathode undergoes a sigmoid deflection in two opposite directions, like the letter S, with the sigmoid deflection of each being a mirror image of the other.

7 Claims, 3 Drawing Sheets

DUAL CATHODE SYSTEM FOR ELECTRON BEAM INSTRUMENTS

ORIGIN OF INVENTION

The invention described herein was made in the performance of work under a NASA contract, and is subject to the provisions of Public Law 96-517 (35 USC 202) in which the Contractor has elected not to retain title.

BACKGROUND OF THE INVENTION

This invention relates to a system for providing an electron beam on a fixed axis from a selected one of two cathodes equidistant from the axis and in the same plane passing through the axis. Upon selection of one cathode, it is turned on while the other cathode is off, and vice versa, to maintain an electron beam from either cathode.

For long duration aerospace missions, and for other applications, there is a need to maintain the operation of electron beam instruments, such as a scanning electron microscope (SEM), despite the failure of the electron beam cathode. A miniaturized, light weight, low powered SEM and x-ray analysis system designated as the Scanning Electron Microscope and Particle Analyzer (SEMPA) instrument for space-flight applications has been under development for the last eight years. One proposed application of the SEMPA instrument is for the NASA Marner Mark II Comet Rendezvous/Asteroid Flyby (MMII CRAF) mission for launch in the 1990's.

During the CRAF mission, the spacecraft will be in the vicinity of the comet for about three years. In that interval the SEMPA is expected to sample the dust leaving the comet surface at least 50 times, and spend a total of about 1000 hours doing imaging and x-ray analysis of the collected dust.

Such a long duration mission places great demands on the reliability and durability of its scentific instrument packages. In particular, for SEMPA, the x-ray detector and cathode systems have been the subject of special concern. Since the probability of failure of such parts is significant, it is imperative that redundancy be provided for those parts. The cathode of an electron beam source is of particular concern for it requires careful examination of possible techniques for achieving cathode redundancy. It would be desirable to have two cathodes for alternate use in the SEMPA instrument, each designed to provide an electron beam on a fixed electron optical axis for about 1000 hours of operation, or one of lanthanum hexaboride (LaB$_6$) designed for a long life, but unstable source of electrons, and the other of tungsten designed for a stable, but short-life source of electrons.

There are two practical techniques for providing redundant cathodes. One is to provide a mechanical system, such as a shuttle or carousel, that could place either of two cathodes on the electron optical axis of the instrument. Such a system is certainly feasible, but would probably be heavy, expensive, and have its own reliability concerns. The alternative approach is to have two fixed cathodes, and use beam deflection fields to steer the electron beam from each onto a fixed electron optical axis. When one cathode fails, the alternate is turned on, and the necessary beam deflection fields are activated to steer the emitted electrons onto the fixed electron optical axis. The present invention pursues this alternate approach.

SUMMARY OF THE INVENTION

In accordance with the present invention, dual cathode redundancy for an electron beam source has been achieved for use in an instrument by a beam deflection system comprised of three electromagnets, each with separate pole pieces designed and arranged to permit operation with either of two fixed cathodes equidistant from a fixed electron optical axis. The axes of the two cathodes, each with its own Wehnelt and Herzog shunt, and the electron optical axis of the electron beam source, are coplanar.

Two of the electromagnets, a separate one associated with each of the two cathodes, are disposed close to the Herzog shunts of the two cathodes on opposite sides of the electron optical axis. Each deflects the beam from its associated cathode away from its own axis and toward the fixed electron optical axis. As the electrons of each beam leave the electromagnetic fields next to the Herzog shunt, they enter the field of a third electromagnet that is centered on the electron optical axis. The polarity of this third electromagnetic field is selected for one cathode in a direction that deflects the beam into convergence with the electron optical axis. For the alternate cathode, the polarity of the third electromagnetic field is reversed. The strength of the third electromagnetic field is just sufficient to change the curved path of the electrons into convergence with the electron optical axis where the beam leaves the third field. The electron beam axis is thus caused to be along the electron optical axis as the electron beam passes through a Herzog shunt at the exit of the third field.

Each of the two electromagnets next to the Herzog shunt near the Wehnelts utilizes a pair of pole pieces that are parallel to each other and placed between coils fixed between parallel arms of a C-shaped yoke. The pole pieces of these two electromagnets are equidistant from the plane of the electron optical axis and the axes of the coplanar cathodes, and are shaped to have an entry edge perpendicular to the cathode axes and to have an exit edge perpendicular to the electron trajectories.

The third magnetic field utilizes a pair of electromagnet pole pieces that are parallel to each other, coplanar with the pole pieces of the first two electromagnets, and centered on the electron optical axis. The two pole pieces are equally spaced from the optical axis, and are shaped to have an entry edge on each side of the optical axis that is perpendicular to the electron trajectory from the alternate cathodes. The result is that the electrons from each cathode undergo a sigmoid deflection in two opposite directions, like the letter S, with the sigmoid trajectory of each being a mirror image of the other due to the polarity of the first two electromagnetic fields being opposite, and the polarity of the third being selected to be opposite the first or the second electromagnet, depending on whether one cathode or the alternate cathode is on. The polarity of the third electromagnet selected to reverse the sigmoid curvature is prearranged to be correct for reversing the sigmoid curvature of the electron trajectory to place it along the optical axis at the exit from the third electromagnetic field. The inflection point, the point where the curvature reverses, is midway between the exit edges of the pole pieces of the first two electromagnets, and the entry edge of the pole pieces of the third electromagnet.

Although the electromagnetic poles are equally spaced from the intended plane of the sigmoid path of the electron beams, it is desirable to provide for adjustment to assure that the electron beam emerge from the third electromagnet with its axis coincident with the optical axis. This may be accomplished by applying a trim voltage $+V_T$ to the pole pieces so that they act as electrostatic deflection plates.

Although the preferred embodiment utilizes electromagnet fields to cause the electrons to undergo a sigmoid deflection, with the trajectory for electrons from one cathode being a mirror image of the trajectory for electrons from the other cathode, it is evident that electrostatic fields may be used instead. This is because of the well known equivalence between electrostatic and electromagnetic means for deflecting electron beams. Consequently, it is intended that the term electron deflection fields or means types encompass both types of deflection means.

DETAILED DESCRIPTION OF PREFERRED EMBODIMENT

Figure 1:
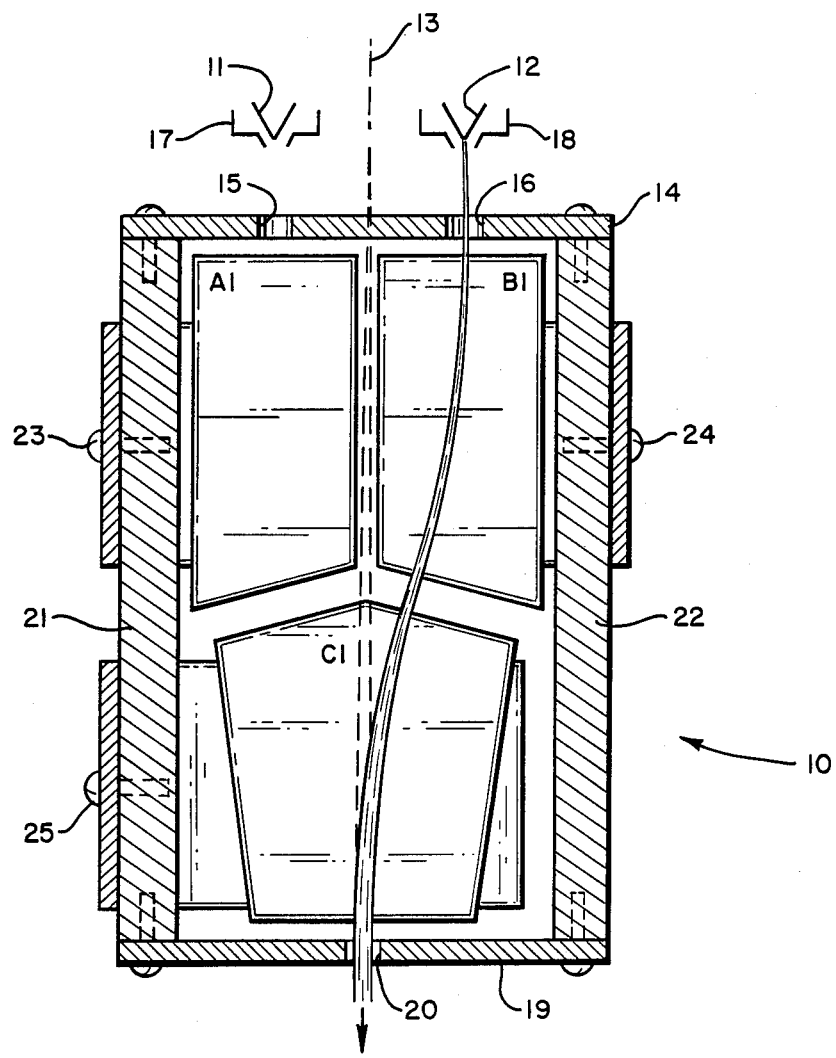
FIG. 1 illustrates in a cross section taken on a line 1—1 of FIG. 2 the arrangement of pole pieces for three electromagnets that produce fields for causing electrons from alternate cathodes to undergo a sigmoid deflection in two directions, like the letter S, to emerge along a fixed optical axis parallel to and equidistant from the two cathode axes.
Figure 2:
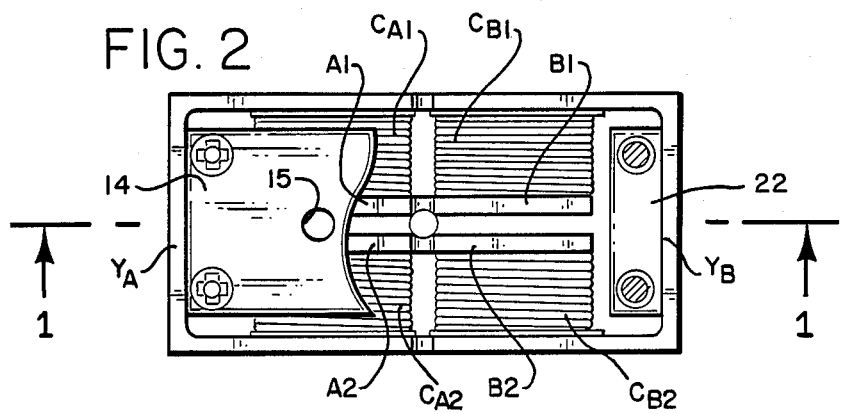
FIG. 2 is a plan view of the assembly of pole pieces shown in FIG. 1 with the Herzog shunt partially broken away, but without the cathodes and Wehnelts illustrated schematically in FIG. 1.

Referring to FIG. 1, which shows a cross section taken on centerline 1—1 in FIG. 2, a dual cathode electron beam source 10 comprises redundant cathodes 11 and 12 equidistant from an electron optical axis 13 and a Herzog shunt 14 having two apertures 15 and 16 aligned with the cathodes, and two Wehnelts 17 and 18 which converge the electrons emitted by the cathodes into beams. Only one beam from the cathode 12 is shown since only one cathode is to be selectively turned on at any given time. The alternate cathode is to be turned on only as a substitute, either upon failure of the one cathode, or to select from two different types of cathodes. One may be a tungsten cathode known to be stable, but having a short life, and therefore used sparingly. The other may be a lanthanum hexaboride (LaB$_6$) cathode known to have a long life but not as stable as the tungsten cathode.

Spaced from the entry Herzog shunt 14 is an exit Herzog shunt 19 having a single aperture 20 that is aligned with an optical axis 13. These Herzog shunts are permanently spaced about 60 mm apart by support members 21 and 22 which support three electromagnets comprising pole pieces A1, B1 and C1 positioned as shown in FIG. 1, and opposite pole pieces A2, B2 and C2, all of which are shown in FIG. 3, each held by coils to yokes of the respective electromagnets shown in perspective in the exploded view of FIG. 3.

Figure 3:
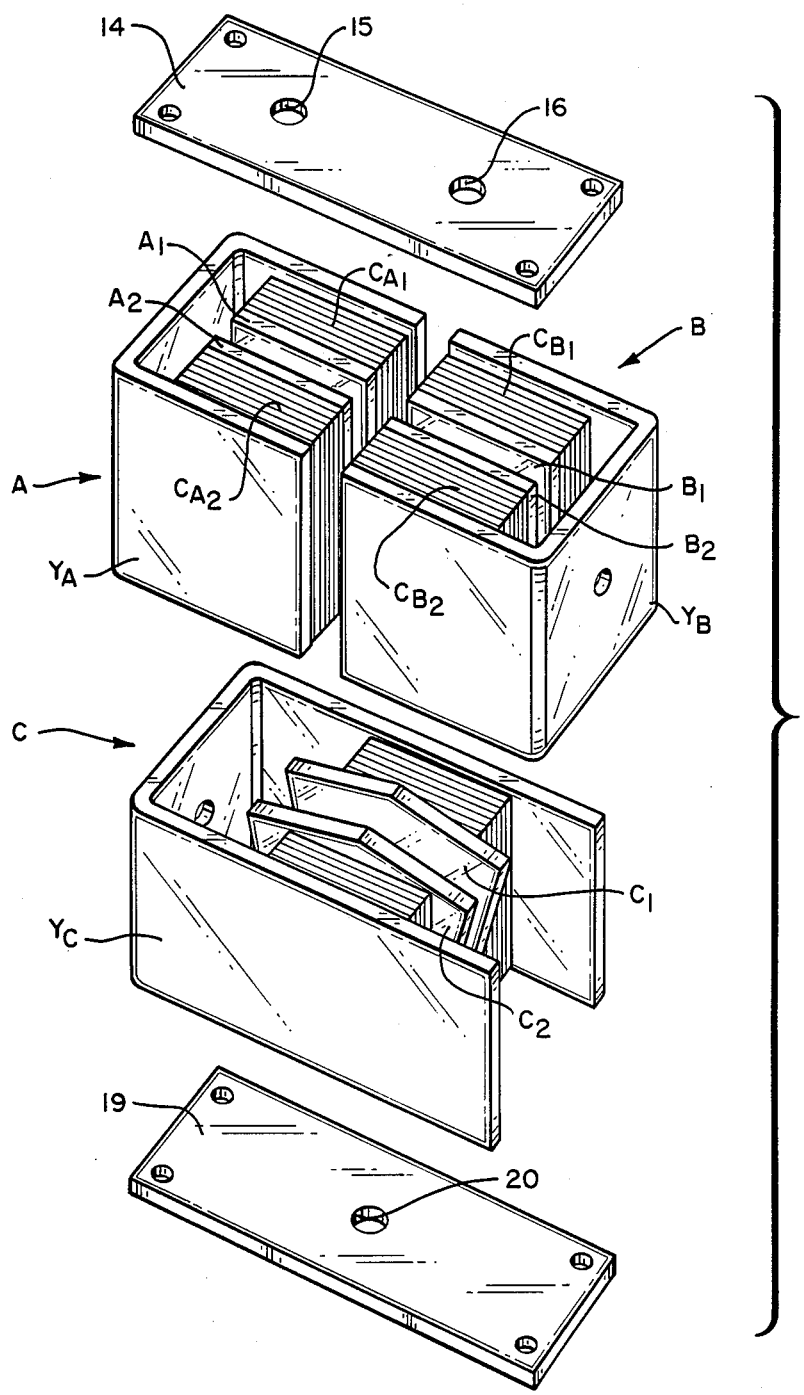
FIG. 3 is an exploded view of the assembly shown in FIGS. 1 and 2, but omitting the supports shown in FIG. 1 and FIG. 2 for the assembly, and again omitting the cathodes and Wehnelts.

For simplicity, supports 21 and 22 are omitted from FIG. 3. They are made of nonmagnetic material, such as brass or aluminum. Once the Herzog shunts 14 and 19 (made of soft iron) are secured by screws at each corner to the supports, there is provided a rigid frame for support of the three electromagnets A, B and C with their pole pieces A1, B1 and C1 coplanar (shown above the transverse centerline 1—1 in FIG. 2). The pole pieces A2, B2 and C2 are similarly coplanar and spaced on the other side of the transverse centerline 1—1 so that the gaps of the electromagnets are centered on a plane passing through the electron optical axis 13 and the centerline 1—1. The yokes $Y_A$, $Y_B$ and $Y_C$ of the electromagnets A, B and C are secured to the supports 21 and 22 with screws 23, 24 and 25, respectively. The respective pairs of coils $C_{A1}$, $C_{A2}$; $C_{B1}$, $C_{B2}$; and $C_{C1}$, $C_{C2}$ of the electromagnets A, B and C are secured to their yokes, such as by epoxy, and the respective pairs of pole pieces A1, A2; B1, B2; C1, C2 are secured to their coils, again such as by epoxy. A schematic electrical circuit diagram of the electromagnets is shown in FIG. 4.

If a constant current is applied to coils of electromagnets A and B from a constant current source 30, the pole pieces will be magnetized N and S according to the sense of the winding and the direction of the current. Assuming the direction of the current in the electromagnet B is upward such that, following the right hand rule, the pole pieces are magnetized as shown in FIG. 4 (with flux lines downward across the gap), the downward direction of the electrons into the paper as viewed in FIG. 4 results in a force to the left on the electrons traversing the gap. This force produces the sigmoid path of the electrons past the pole piece B1 as shown in FIG. 1. Similarly, a current applied to the electromagnet A that establishes an opposite field in its gap, produces a sigmoid path of the electrons past the pole piece A1 that is a mirror image of the path past the pole piece B1 shown in FIG. 1.

Figure 4:
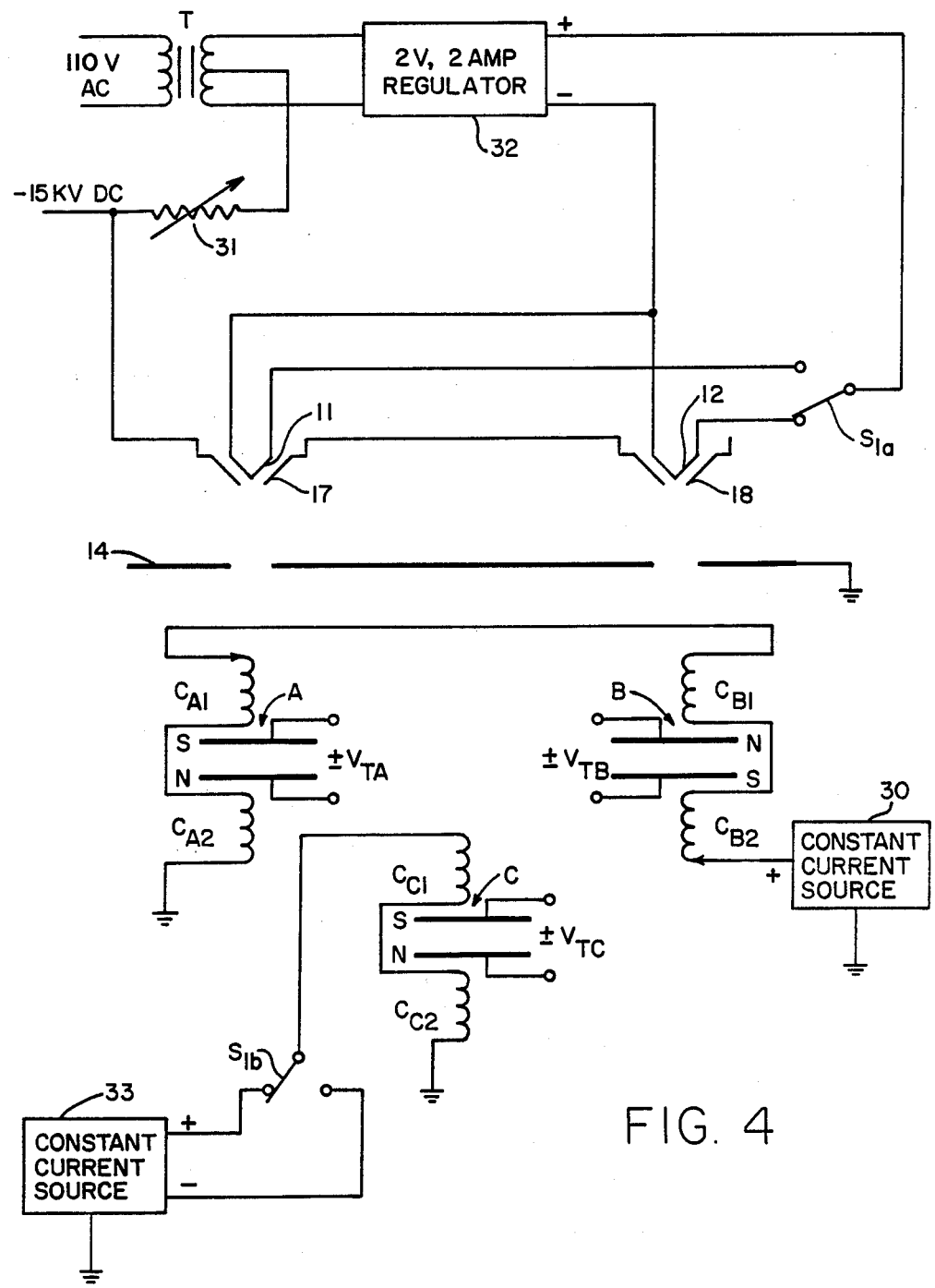
FIG. 4 illustrates schematically the electrical circuit for electromagnetic and electrostatic deflection of electron beams in the assembly described with reference to FIGS. 1, 2 and 3.

To deflect the electrons with a reverse sigmoid path while traversing the plates C1 and C2 of the third electromagnet C, a current is applied to its coils in a direction opposite to the coils of the electromagnet A or B of the active cathode 11 or 12, such as opposite to the coils of the electromagnet B as shown in FIG. 4 in the case of cathode 12 being active as shown. A single-pole, double-throw switch $S_{1b}$ shown in FIG. 4 automatically reverses the direction of current in the electromagnet C when a single-pole, double-throw switch $S_{1a}$ is switched from one cathode to the other. The Wehnelts 17 and 18 are connected to a source of $-15$ kV DC, and to a center tap of a secondary winding of a transformer T by a potentiometer 31 that reduces the voltage to the cathodes to $-14.5$ kV. The primary winding of the transformer is connected to 110 V AC. That transformer may be a 1:1 transformer; it is used simply to isolate the power (4 watts) to the cathode from the $-15$ kV bias voltage applied to the Wehnelts, and the $-14.5$ kV applied to the cathodes. A power supply unit 32 floating at $-14.5$ kV DC provides regulated 2 volts DC at 2 amperes to the selected one of the cathodes 11 and 12 which are at $-14.5$ kV DC with rspect to the Herzog shunt (anode) 14. This low power (4 watts) flows through the switch $S_{1a}$ and the selected cathode.

The constant current source 30 could be selectively connected to the electromagnets A, and B according to which cathode 11 and 12 is selected, but it is preferred to connect them in series to increase the load on the constant current source 30. A separate constant current source 33 is shown for the electromagnet C. Its coils could be connected in series with those of electromagnets A and B, but switch $S_{1b}$ would then have to be expanded to a double-pole, double-throw switch to reverse the direction of current through it when cathode 11 is selected. The advantage of having the coils of all three electromagnets in series would be to use a single constant current source and increase the load on the one constant current source; the higher the load, the more efficient the current source. A more significant advantage is that any instability in the current source would effect both of the electromagnets in use, A and C, or B and C equally, so the effect of the reduced or increased magnetic fields would be automatically compensated almost fully; any uncompensated effect that may be detected will be a slight deviation of the electron beam with the electron optical axis 13. That may be compensated by the instrument utilizing the electron beam, but with proper care in the design of the common current source, any deviation will not be detectable.

The parameters of a specific example will now be described. The two cathodes with Wehnelts are located 8 mm on either side of the microscope electron optical axis 13. The Wehnelt tips are 5 mm from the top of the Herzog shunt 16. The design radius of curvature of the trajectories is 107.75 mm and the deflection angles are each 15.19°. The magnet field necessary to deflect the 15 keV electrons in the 107.75 mm radius through the fields is only about $3.8 \times 10^{-3}$ tesla (38 gauss) so that the magnet yokes are thin and light. The fields are homogeneous with the electromagnets assembled as shown, but may be made inhomogeneous to shape the electron beam in one way or another to reduce astigmatism, such as by bringing the plates closer as the bottom, or shaping the plates to have a face that is other than planar.

The space between the opposite deflection sectors, i.e., between the pole pieces of electromagnets A and B and the pole pieces of electromagnet C, is twice the space between the pole pieces and the entry and exit Herzog shunts to insure symmetry of the trajectory through each sector. Thus, the inflection point, where the sigmoid deflection reverses direction, is at the center between the space of the pole pieces of electromagnets A and B and the pole pieces of the electromagnet C at a distance from the edges of those pole pieces equal to the spacing of the entry and exit Herzog shunts 14 and 19 from the pole pieces.

The edges of the pole pieces for the electromagnets are shaped to be perpendicular to the electron beam at the points of entry and exit. Either cathode 11 or cathode 12 can be turned on, and with appropriate choice of magnetic and electric field strengths, the electron beam from either cathode can be made to pass through the exit aperture 20 and down the optical axis 13. A cathode is turned on normally at a potential of $-14.5$ kV with respect to ground and the magnet assembly. To use the electron beam from cathode 11, for instance, electromagnets A and C would be provided with opposite polarities and with the current in the coils preadjusted so that the electron path forms a double curvature sigmoid that brings the beam into coincidence with the optical axis.

The shapes of the boundaries of the magnetic fields are controlled by the Herzog shunts and gaps at the entry and exit of the magnets. The controlled boundaries insure symmetry of the trajectory about the trajectory inflection point. The symmetry eliminates first order errors in beam position at the exit from the assembly due to small changes in cathode voltage.

In practice, the fields of the coils alone may not bring the beam into exact coincidence with the optical axis 13. If not, trimming DC voltages may be applied to the electrically isolated and insulated pole pieces of the electromagnets to deflect the electrons to precise coincidence with the optical axis. Magnetic and electrostatic deflections occur in mutually perpendicular directions and both are perpendicular to the electron direction. Thus the use of electric fields in the same region as the magnetic fields adjusts the position of the electron beam in a direction normal to the magnetic deflection, i.e., in a direction normal to the pole pieces shown in FIG. 2 and FIG. 4.

The axes of the two cathodes, the Herzog shunt apertures and the electron beam trajectories are made coplanar so that mechanical alignment with the electron beam instrument (not shown) can be achieved with simple rotation and translation of the cathode assembly on a sliding O-ring vacuum seal. Fine alignment in one direction is achieved by adjusting magnetic field strengths. In the perpendicular direction (parallel to the magnetic field flux lines), fine alignment is achieved by applying potentials up to plus or minus 150 volts to the electrically isolated magnet pole pieces as just noted and shown schematically in FIG. 4. Because the magnet gaps are only 3 mm, potentials of this magnitude provide substantial electrostatic deflection.

Although this dual cathode electron system has been designed for a particular SEM application, it could prove valuable in other applications where cathode reliability is critical. For example, it may be applicable to electron beam lithography, Auger analysis, and microfocus X-ray sources.

An alternative (but equivalent) design that reduces complexity may include combining electromagnets A and B into one with large pole pieces and a switch to reverse current flow according to which cathode is selected. Other components may include the use of inhomogenous magnetic fields to eliminate astigmatism, as noted above. The beam position is, as expected, quite insensitive to cathode voltage changes. Any small sensitivity detected may be due to changes in the angle at which the beam exits the Herzog shunt apertures 20. Still other alternatives may occur to those skilled in the art. Consequently, it is intended that the claims appended hereto encompass those alternatives which are equivalent to what has been disclosed.

What is claimed is:

1. Apparatus for providing an electron beam on a fixed electron optical axis from a selected one of two cathodes positioned on opposite sides of said electron optical axis and equidistant from said electron optical axis, comprising two cathodes, each cathode having a Wehnelt and Herzog shunt for forming an electron beam on an axis parallel to said optical axis, said electron optical axis and said axis of each cathode being coplanar, means for selectively turning on either one of said cathodes to emit an electron beam, and means for deflecting said electron beam of the selected cathode away from the axis of the cathode emitting said beam and toward said electron optical axis, and then in an opposite direction into convergence with said optical axis, wherein said deflecting means produces a sigmoid trajectory for electrons from the cathode selected together with a sigmoid deflection required to bring the electron beam of the selected cathode into convergence with said optical axis.

2. Apparatus as defined in claim 1 wherein said deflecting means is comprised of a first means for producing an electron deflection field having its lines of deflection force perpendicular to the cathode axes and oriented for a deflection in a direction toward said optical axis, and a second means for producing an electron deflection field having its lines of deflection force perpendicular to the cathode axes and oriented for a deflection in a direction opposite the deflection of said first means for producing an electron deflection field.

3. Apparatus as defined in claim 2 wherein said first means for producing an electron deflection field is comprised of first and second elecromagnetic means having a gap defined by pole pieces disposed on opposite sides of the plane of the electron optical axis and cathode axes, and means for producing current flow through said first and second electromagnet means to create separate magnetic fields, one polarized in one direction for one cathode and one polarized in an opposite direction for the other cathode, and said second means for producing an electron deflection field is comprised of an electromagnetic means having a gap defined by pole pieces of a size sufficient to overlap an electron beam from either cathode and means for selecting the polarization of said electromagnetic means of said second deflecting means according to which cathode is selected, said pole pieces of said second means for producing an electron deflection field being disposed on opposite sides of the plane of the electron optical axis and cathode axes.

4. Apparatus as defined in claim 2 wherein said first means of said deflecting means for producing an electron deflection field is comprised of two electromagnets each having its own gap defined by pole pieces, the pole pieces of one electromagnet being disposed opposie the axis of one cathode and the pole pieces of the other electromagnet being disposed opposite the axis of the other cathode, and each electromagnet having its own coils connected in series to receive constant current in such a direction through each as to produce separate and oppositely poled magnetic fields, and said second means for producing an electron deflection field is comprised of a third electromagnet having its own coils and means for reversing the direction of current through said coils of said third electromagnet for a magnetic field of one polarity in deflecting electrons from one cathode in said sigmoid deflection and of opposite polarity in deflecting electrons from the other cathode in said sigmoid deflection.

5. Apparatus as defined in claim 3 or 4 wherein said pole pieces of electromagnetic means of said first means for producing an electromagnetic deflection are shaped to have edges perpendicular to electron beams from said two cathodes where the beams enter the gap and where the beams exit the gap between said pole pieces of said first means for production an electron deflection field, and wherein said pole pieces of the electromagnetic means of said second means for producing an electromagnetic deflection are shaped to have edges perpendicular to electron beams from said two cathodes, where the beams enter the gap and where the beams exit the gap between said pole pieces of said second means for producing an electron deflection field.

6. Apparatus as defined in claim 5 including means for applying a dc voltage separately to said pole pieces of each electromagnet to produce an electrostatic field for deflection of said electron beams in a direction perpendicular to the deflection of each electromagnet, so that the plane of said sigmoid trajectory is adjusted relative to the plane of said electron optical axis and cathodes.

7. Apparatus as defined in claim 5 wherein each electromagnet includes a yoke and including a Wehnelt positioned in front of each cathode, an entry Herzog shunt having two apertures, one in line with each Wehnelt and cathode to define said cathode axis, an exit Herzog shunt having an aperture in line with said electron optical axis, two support members spacing said entry and exit Herzog shunts and supporting said yokes.

* * * * *